(12) United States Patent
Le

(10) Patent No.: US 7,852,705 B1
(45) Date of Patent: Dec. 14, 2010

(54) METHOD OF AND CIRCUIT FOR CONFIGURING A PLURALITY OF MEMORY ELEMENTS

(75) Inventor: Tony Viet Nam Le, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 1113 days.

(21) Appl. No.: 11/527,887

(22) Filed: Sep. 27, 2006

(51) Int. Cl.
*G11C 8/02* (2006.01)

(52) U.S. Cl. ............... 365/231; 365/230.02; 711/202

(58) Field of Classification Search ............... 365/231, 365/230.02; 711/202, 103, 104; 370/351
See application file for complete search history.

(56) References Cited

U.S. PATENT DOCUMENTS

| | | | | |
|---|---|---|---|---|
| 6,104,836 A | * | 8/2000 | Buckley et al. | 382/236 |
| 7,193,895 B2 | * | 3/2007 | Jin et al. | 365/185.09 |
| 7,254,691 B1 | * | 8/2007 | Ebeling | 711/202 |
| 7,386,650 B2 | * | 6/2008 | Watanabe | 711/2 |
| 2003/0002474 A1 | * | 1/2003 | Alexander et al. | 370/351 |

* cited by examiner

*Primary Examiner*—Tuan T Nguyen
*Assistant Examiner*—Toan Le
(74) *Attorney, Agent, or Firm*—John J. King

(57) ABSTRACT

A method of configuring a plurality of memory elements having selectable dimensions, the method comprising the steps of selecting a width of a data word to be output by a circuit having the plurality of memory elements; selecting a width for memory locations of the plurality of memory elements, the width for the memory location being less than the width of a data word; configuring the plurality of memory elements to have the selected width; and concatenating the outputs for the plurality of memory elements to generate a concatenated output comprising a data word. A circuit for configuring a plurality of memory elements having selectable dimensions is also disclosed.

20 Claims, 5 Drawing Sheets

METHOD OF AND CIRCUIT FOR CONFIGURING A PLURALITY OF MEMORY ELEMENTS

COMPUTER PROGRAM LISTING APPENDIX

This application includes a computer program-listing appendix on a single compact disc, the contents of which are incorporated herein by reference in their entirety. The compact disc contains a first 24 KB file entitled "tlm_bram_array.v" created May 4, 2006.

FIELD OF THE INVENTION

The present invention relates generally to integrated circuits, and in particular, to a method of and a circuit for configuring a plurality of memory elements.

BACKGROUND OF THE INVENTION

Integrated circuits are an integral part of any electronic device. A variety of integrated circuits are often used together to enable the operation of the electronic device. While integrated circuits are typically designed for a particular application, one type of integrated circuit which enables flexibility is a programmable logic device. A programmable logic device (PLD) is designed to be user-programmable so that users may implement logic designs of their choices. One type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. In some CPLDs, configuration data is stored on-chip in non-volatile memory, then downloaded to volatile memory as part of an initial configuration sequence.

Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g. a programmable ROM (PROM), an erasable PROM (EPROM), or an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block. The configuration bits not only configure the logic blocks, but also the dimensions of the RAMs to have a certain depth (i.e. number of rows) and width (i.e. length of a word in a row). At the end of this start-up phase, the PLD is now specialized to the user's design, and the PLD enters into a "user" mode as part of its normal operation. While PLDs provide flexibility in the implementation of a circuit, it is important to optimize the resources of the PLD, such as the available logic and interconnect resources. Accordingly, it is useful to reduce the logic necessary to implement a given circuit whenever possible.

In many electronic designs, it is necessary to implement a large addressable memory space. Another type of integrated circuit that is found in electronic devices is a memory, such as a random access memory (RAM). Depending upon the requirements of the circuit, RAM may be provided by one or more separate integrated circuits. Such an address space is often larger than the size of a standard RAM available to the designer. Therefore, the address space requires more than one RAM to implement the necessary memory, and data from the various RAMs may need to be multiplexed to get the desired output. A common way to structure the RAM array is to align the RAMs into rows of fixed depth. As shown for example in FIG. 1, each RAM of a plurality of RAMs 102 has a fixed arrangement comprising 512 rows of 36 bit words (i.e. 512×36). Each RAM is coupled to a multiplexer 104 for selecting an output of one of the RAMs. A control circuit 106 coupled to receive control signals and input data controls a read/write logic circuit 108 to enable writing data to a RAM or reading data from a RAM. While conventional configurable logic devices comprise blocks of RAM, often called BRAMs, having configurable dimensions, such blocks for a given application are chosen to have a word size for that application. The size of the RAM is selected so that the RAMs are all of the same size and have a width for storing words of a predetermined width, such as 36 bit words in this example. However, such arrangements require more complex logic arrangements to implement the RAMs, leading to inefficient use of logic resources. That is, the selection logic circuitry for selecting a row of a given RAM increases with the number of RAMs having the addressable row.

Accordingly, there is a need for an improved circuit for and method of configuring a memory array.

SUMMARY OF THE INVENTION

A method of configuring a plurality of memory elements having selectable dimensions is disclosed. The method comprises steps of selecting a width of a data word to be output by a circuit having the plurality of memory elements; selecting a width for memory locations of the plurality of memory elements, the width of the memory locations being less than the width of a data word; configuring the plurality of memory elements to have the selected width; and concatenating the outputs for the plurality of memory elements to generate a concatenated output comprising a data word. The method may further comprise a step of arranging the plurality of memory elements into groups of memory elements, wherein the sum of the widths of the memory elements, for each group of memory elements, is equal to the width of the data word. Finally, the step of arranging the plurality of memory elements into groups of memory elements may comprise arranging each group of memory elements to have an equal number of memory elements.

According to an alternate embodiment, a method comprises steps of selecting a width of a data word to be output by a circuit having the plurality of memory elements; configuring each memory element of the plurality of memory elements to have a width less than the width of the data word; arranging the plurality of memory elements into groups of memory elements; concatenating the outputs of the memory elements, for each group of memory elements, to generate an output comprising a data word; and selecting a concatenated output of a group of memory elements as an output data word. The step of arranging the plurality of memory elements into groups of memory elements may comprise arranging the plurality of memory elements such that the sum of the widths of the memory elements, for each group of memory elements, is equal to the width of the data word. Finally, the method may comprise a step of configuring at least one additional memory element not arranged in the groups of memory elements to have a width greater than the width of the memory elements of the groups of memory elements.

A circuit for configuring a plurality of memory elements having selectable dimensions is also disclosed. The circuit comprises a control circuit coupled to the plurality of memory elements, the control circuit configuring the dimensions of the plurality of memory elements; a first plurality of memory elements, wherein each memory element has a width less than a width of a data word stored in the first plurality of memory elements; a first bus coupled to the first plurality of memory elements, the first bus generating a first data word comprising a concatenated output of each memory element of the first plurality of memory elements; and a selection circuit coupled to the first bus and outputting the first data word.

DETAILED DESCRIPTION OF THE DRAWINGS

Figure 2:
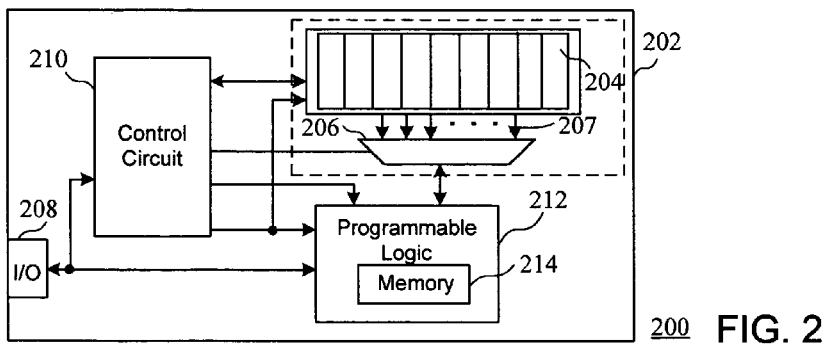
FIG. 2 is a block diagram of a circuit for configuring a memory array according to an embodiment of the present invention.

Turning now to FIG. 2, a block diagram of a circuit for configuring a memory array according to an embodiment of the present invention is shown. In particular, a circuit 200 comprises a memory array 202 having a plurality of configurable memory elements 204, where each memory elements comprises a configurable matrix of memory cells. That is, the memory elements may be configurable to have different dimensions of rows and word lengths. The outputs of the memory elements may be multiplexed by a multiplexer 206, the output of which is selected by the control circuit. Further, configurable interconnects 207 of the circuit 200 enables the memory elements to be connected based upon the dimensions of the memory elements, as will be described in more detail in reference to FIG. 3. An input/output (I/O) port 208 is coupled to a control circuit 210. The control circuit 210 controls both the memory array 202 and a programmable logic circuit 212. The programmable logic circuit may comprise a memory 214 enabling the configuration of the programmable logic, as will be described in more detail below in reference to FIGS. 3 and 4.

The control circuit 210 preferably enables the structuring of a group of generic addressable memories (e.g. RAMs or ROMs) into an optimal layout that minimizes the need for external logic to implement the memories. While the memory elements will be referred to as RAMs by way of example, the circuits and methods described below apply to any memory element, such as "ROM" (read-only memory), "register file" or any other type of addressable memory element. Further, if the RAM is of a fixed size but the dimensions are selectable, it is desirable to make the RAMs in each row as narrow (in data size) but as deep (in address range) as possible. That is, each break between rows, such as the breaks between the nine rows of the conventional circuit of FIG. 1, requires another intermediate vector of data to be multiplexed and thus adds to the logic of the RAM array. The need for such an optimal arrangement may lead to a non-regular pattern of the array, with some RAMs having different dimensions from others. A method of generating a generic pattern, which may be regular or non-regular, will be described in more detail in reference to FIG. 3.

Figure 3:
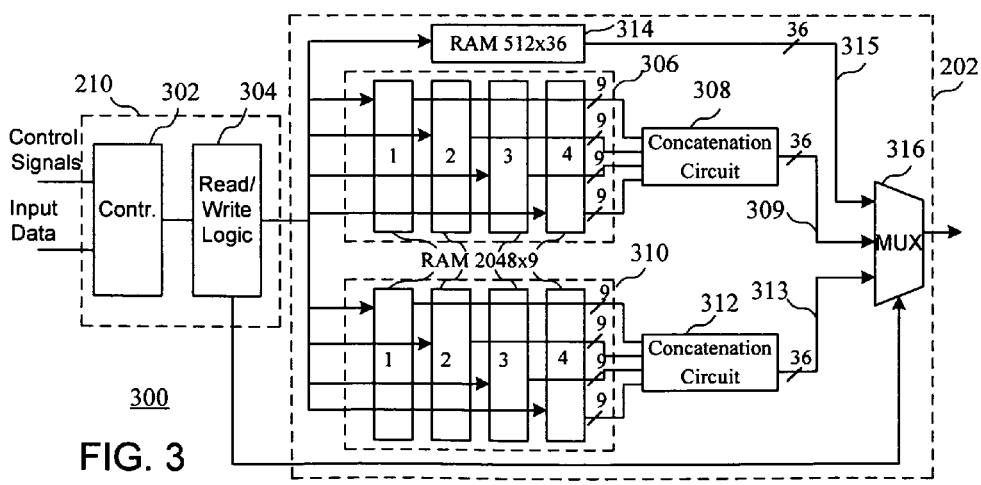
FIG. 3 is a block diagram of a configuration of a memory array according to an embodiment of the present invention.

Turning now to FIG. 3, a block diagram of a configuration of a plurality of memory elements according to an embodiment of the present invention is shown. As an example, a programmable logic device may comprise configurable RAMs containing eighteen kilobits (i.e. 18,432 bits) of data. Each such memory element may be configured as a 2048×9, 1,024×18 or 512×36 RAM, where the first number is the number of addressable memory locations, and the second number is the width of the data in each memory location. In an application that stores data thirty-six bits wide, each 36-bit word may be stored across 4 RAMs of 2048×9, 2 RAMs of 1024×18, or 1 RAM of 512×36. Each of these three configurations would comprise a row of RAMs having 4, 2 or 1 RAMs, respectively.

Figure 1:
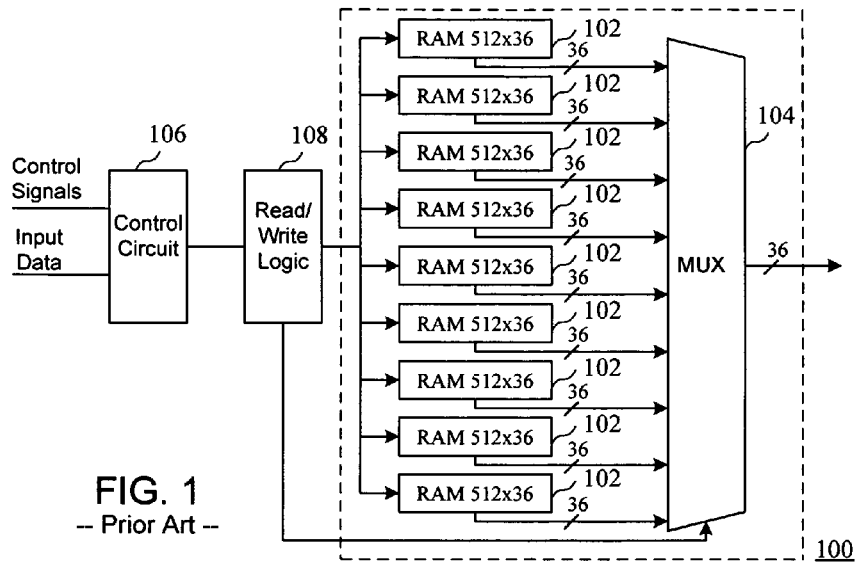
FIG. 1 is a block diagram of a conventional circuit showing a configuration of memory array.

In the example above, if there are exactly nine configurable RAMs available, nine single-RAM rows of 512×36 each may be used as shown in FIG. 1, providing a total array size of 4608×36. Each RAM row would subtend 512 address locations. Therefore, the lowest-order row, designated Row 0, would subtend locations 0-511, the next row (i.e. Row 1) would subtend locations 512-1023, etc., up to the highest address of 4607. However, when reading from this RAM array, one of nine data values which are read simultaneously is selected. Accordingly, a 9-to-1 multiplexer is required. As shown in FIG. 3, the control circuit 210 comprises a controller 302 coupled to control read/write logic 304. Reducing the number of inputs to the output multiplexer would reduce the amount of logic of the Read/Write Logic block 304 compared to the read/write logic required to select one of the nine rows using the array of FIG. 1. The controller 302 may be a microcontroller or microprocessor, or some other form of control circuit. Memory array 202 comprises a first row of RAMS 306 comprising four 2048×9 RAMs, designated 1-4. The output of each of the four 2048×9 RAMs is coupled to a concatenation circuit 308 which will receive the four 9 bit buses and provide parallel data on a 36 bit bus according to the order of the RAMs of the row 306 (i.e. the RAM designated 1 may provide the most significant bits and the RAM designated 4 may provide the least significant bits). As will be described in more detail below, a nine bit word output by each of four RAMs on a 9-bit bus is concatenated to form a 36 bit word output by the concatenation circuit on 36-bit bus 309. A second row of RAMS 310 also comprises four 2048×9 RAMs, each of which is coupled to a concatenation circuit 312, the output of which comprises another 36 bit bus 313. Finally, a RAM 314 comprising a third row is configured as a 512×36 RAM coupled to a 36-bit bus 315. The bus at the output of each of the rows of RAMS is coupled to a selector circuit 316 which may comprise an output multiplexer, for example. The selection of the size of the RAMS will be described in more detail below. While a 36 bit word may be generated by concatenating nine 4608×4 RAMs, it may be desirable to select a word size for the RAMs to be nine bits so that each word may contain both data and a parity bit, for example. Accordingly, the word size is configured to be a multiple of 9 bits.

The selection of the input to the multiplexer is selected by a controller 302. Therefore, by having only three rows which are selected by the selection circuit 316, the logic of the Read/Write Logic block 304 for generating the output data is simplified, thereby reducing the amount of circuitry required to implement the circuit. The reduction in circuitry may be significant in a programmable logic device having limited resources. That is, by reducing the circuitry required to implement the BRAMs, additional circuit resources are available for implementing other circuits necessary to implement a design.

Figure 4:
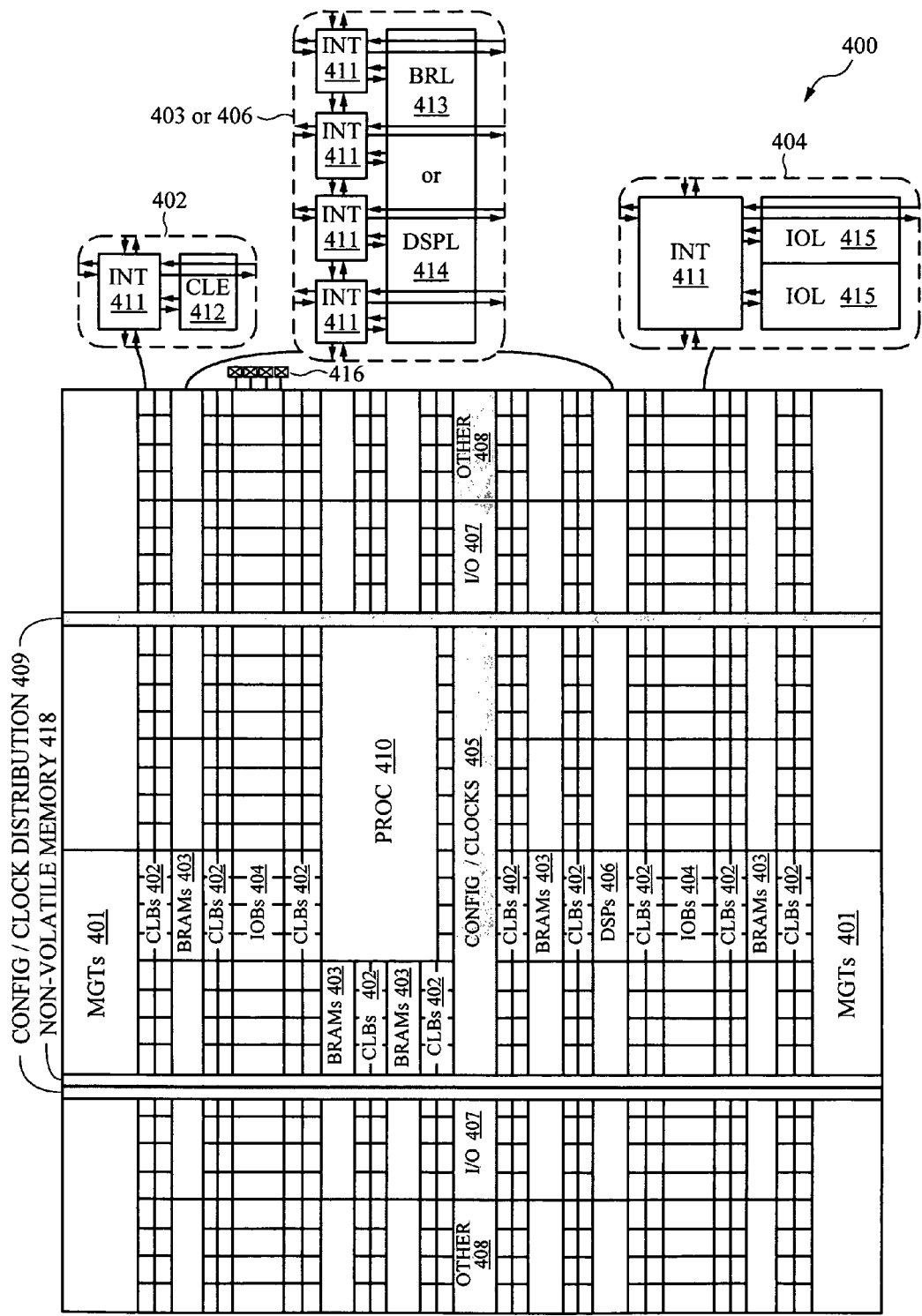
FIG. 4 is a block diagram of programmable logic device for implementing various elements of the circuits of FIGS. 2-3 according to an embodiment of the present invention.
Figure 6:
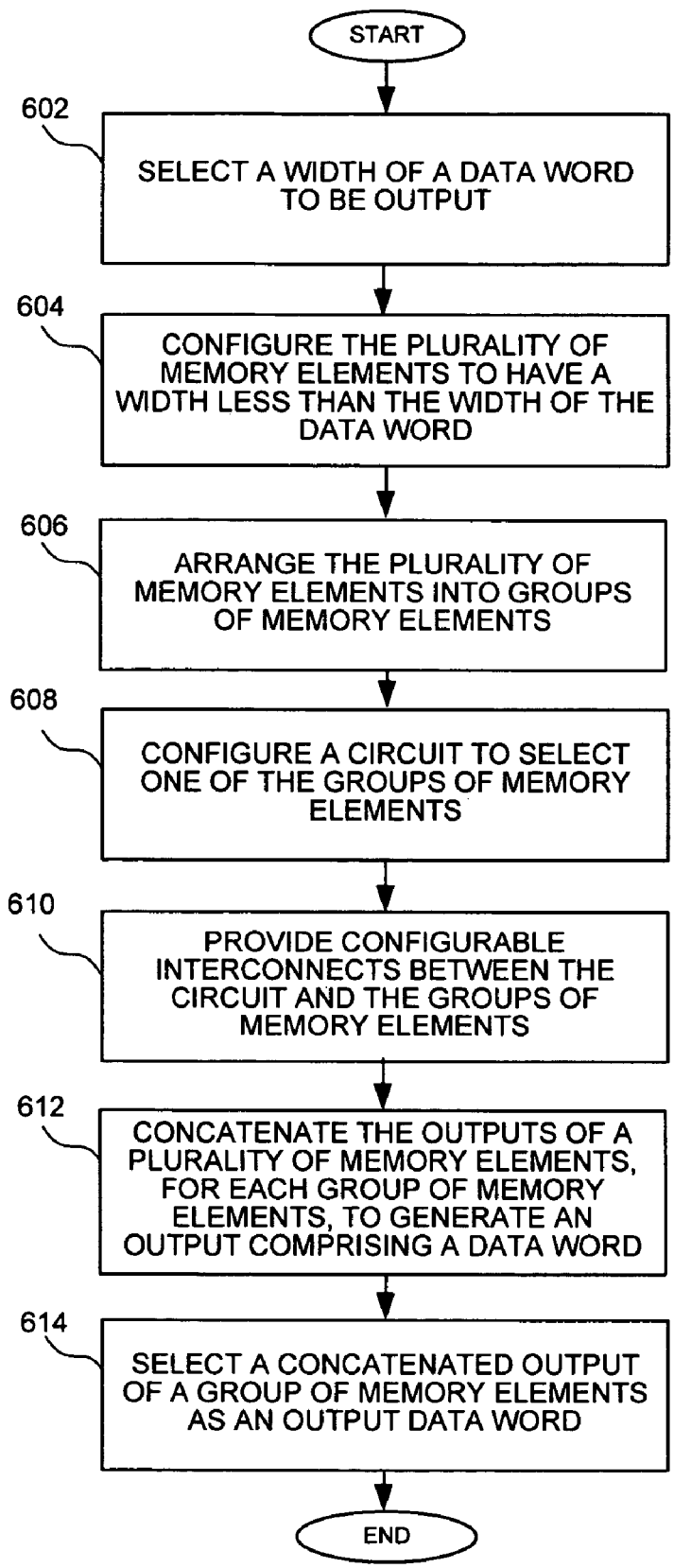
FIG. 6 is a flow chart showing a method of configuring a memory array according to an embodiment of the present invention.
Figure 7:
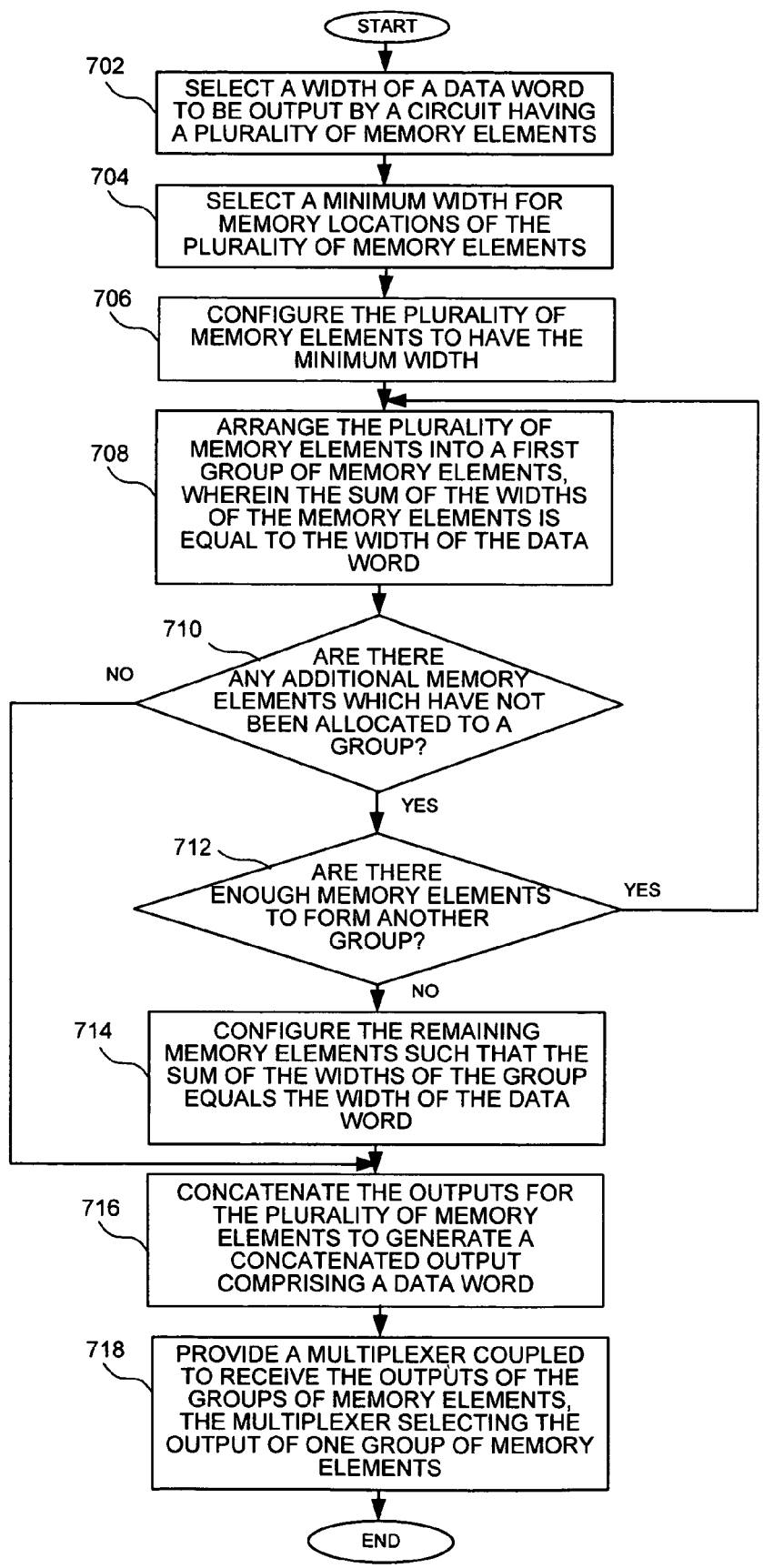
FIG. 7 is a flow chart showing a method of configuring a memory array according to an alternate embodiment the present invention.

Turning now to FIG. 4 is a block diagram of programmable logic device for implementing various elements of the circuits of FIGS. 2-3 according to an embodiment of the present invention, or a circuit for implementing the methods described in FIGS. 6-7. The FPGA architecture 400 of FIG. 4 includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410). The memory array 202 comprising a plurality of RAMs may be implemented using a plurality of BRAMs, while control circuits may also be implemented in CLBs or by a dedicated processor block.

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 may include a configurable logic element (CLE 412) that may be programmed to implement user logic plus a single programmable interconnect element (INT 411). A BRAM 403 may include a BRAM logic element (BRL 413) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 406 may include a DSP logic element (DSPL 414) in addition to an appropriate number of programmable interconnect elements. An IOB 404 may include, for example, two instances of an input/output logic element (IOL 415) in addition to one instance of the programmable interconnect element (INT 411). As will be clear to those of skill in the art, the actual I/O pads 416 connected, for example, to the I/O logic element 415 are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA. Some FPGAs utilizing the architecture illustrated in FIG. 4 include additional logic blocks that disrupt the regular columnar structure making up a large part of the FPGA. The additional logic blocks may be programmable blocks and/or dedicated logic. For example, the processor block PROC 410 shown in FIG. 4 spans several columns of CLBs and BRAMs. Finally, a non-volatile memory 418 may be employed for on-chip storage of configuration data which is used to configure the configuration logic blocks or other programmable tiles as described above.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of programmable logic device, having configuration memory.

Figure 5:
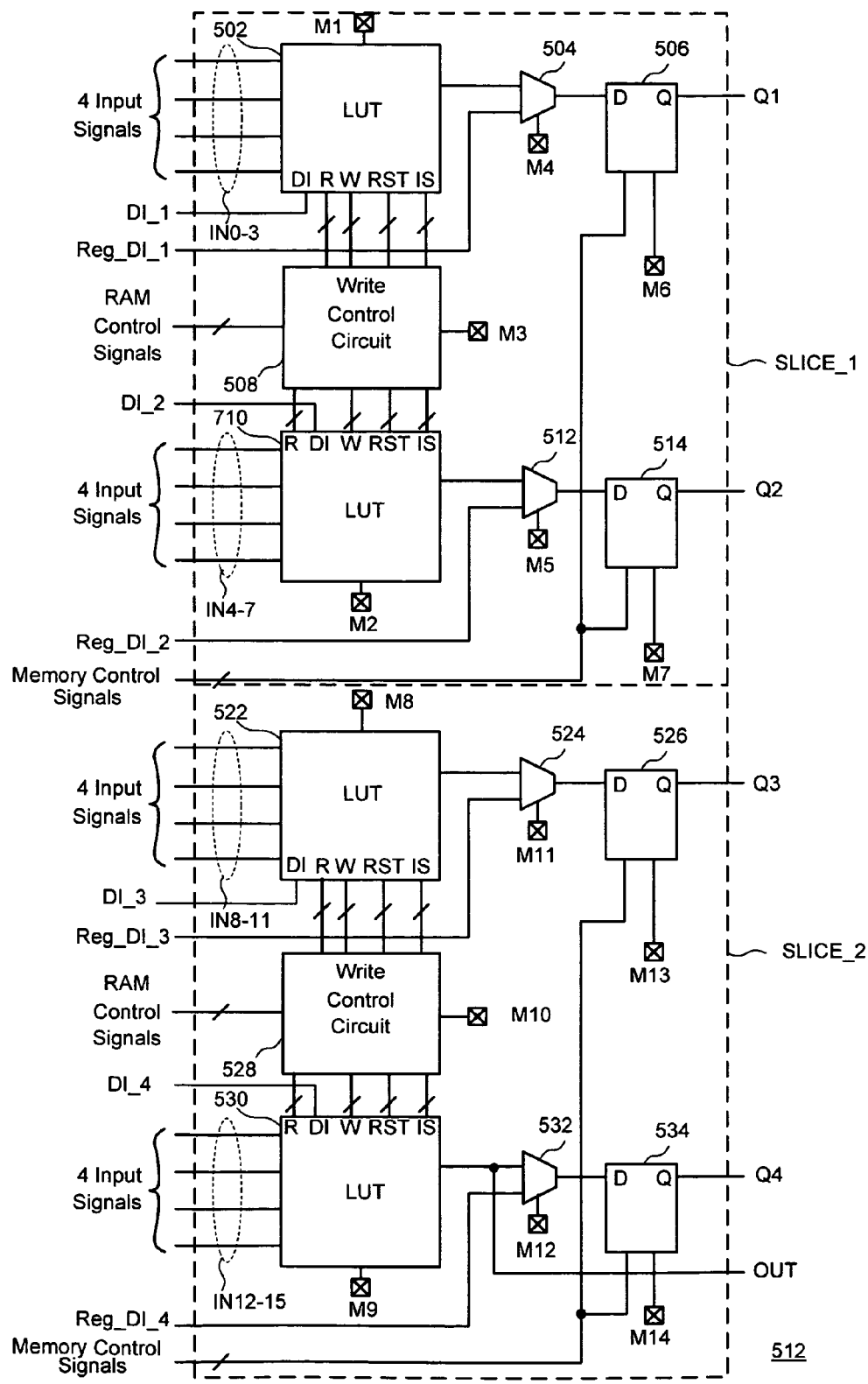
FIG. 5 is a block diagram of a configurable logic element of the programmable logic device of FIG. 4 according to an embodiment of the present invention.

Turning now to FIG. 5, a block diagram of a configurable logic element of the programmable logic device of FIG. 4 according to an embodiment of the present invention is shown. In particular, FIG. 5 illustrates in simplified form a configurable logic element of a configuration logic block 402 of FIG. 4. The configurable logic element shown comprises two similar slices, where each slice comprises a pair of function generators. However, the configurable logic element may comprise more slices, such as four slices, for example. Each function generator may function in any of several modes depending upon the configuration data in the configuration memory locations M1-M14. As set forth above, the configuration memory locations M1-M14 may be changed during a partial reconfiguration of an FPGA to change the mode of the function generator. When in RAM mode, input data is supplied by an input terminal DI_1, DI_2 to the data input (DI) terminal of the associated function generator. Each function generator provides an output signal to an associated multiplexer, which selects between the output signal function generator and an associated register direct input signal Reg_DI_1, Reg_DI_2 from the programmable interconnect element. Thus, each function generator may be optionally bypassed. When in look-up table mode, each function generator implemented as a look-up table has four data input signals IN0-IN3. Slice 1 comprises a function generator implemented as a LUT 502 coupled to a multiplexer 504. In particular, the LUT 502 receives 4 input signals which are decoded to generate an output associated with data stored in the LUT at the address designated by the input signals. The multiplexer 504 is adapted to receive the output of LUT 502 and a registered value of Reg_DI_1. The output of the multiplexer 504 is coupled to a register 506 which generates an output Q1.

A Write Control Circuit 508 is coupled to receive RAM control signals and generate signals to control the LUT 502. In addition to a data input (DI) coupled to receive RAM_DI_1 and conventional read and write control signals coupled to a read enable input (R) and a write enable input (W), the LUT 502 comprises a partial reset input (RST) for receiving a partial reset signal, and an initial state input (IS) for receiving an initial state signal. Such resetting of the memory cells enables resetting the LUT memory during a partial reconfiguration of a programmable logic device, including partial reconfiguration of a device during operation. Similarly, slice 1 comprises a function generator implemented as a LUT 510 coupled to a multiplexer 512. The LUT 510 is adapted to receive input signals IN4-IN7, while the multiplexer 512 is coupled to receive the output of the LUT 510 and a registered value of Reg_DI_2. The output of the multiplexer 512 is coupled to a register 514 which generates an output Q2. The write control circuit 508 also generates a partial reset signal and an initial state signal for selectively resetting or setting one or more of the bits of the LUT 510. One advantage of resetting LUT memory of a device during partial reconfiguration is that it is not necessary to cycle through the required clock cycles to set the correct data after the partial reconfiguration.

Similarly, slice 2 comprises a function generator implemented as a LUT 1222 coupled to a multiplexer 524. The LUT 522 is adapted to receive input signals IN8-IN11, while the multiplexer 524 is coupled to receive the output of the LUT 522 and a registered value of Reg_DI_3. The output of the multiplexer 524 is coupled to a register 526 which generates an output Q3. A Write Control Circuit 528 is coupled to receive RAM control signals and generate signals to control the LUT 522. In particular, input signals IN8-IN11 are decoded to generate an output associated with data stored in the LUT at the address designated by the input signals. The LUT 522 comprises a partial reset input (RST) for receiving a partial reset signal, and an initial state input (IS) for receiving an initial state signal. Similarly, slice 2 comprises a function generator implemented as a LUT 530 coupled to a multiplexer 532. The LUT 530 is adapted to receive input signals IN12-IN16, while the multiplexer 532 is coupled to receive the output of the LUT 530 and a registered value of Reg_DI_4. The output of the multiplexer 532 is coupled to a register 534 which generates an output Q4. The write control circuit 528 also generates a partial reset signal and an initial state signal for selectively resetting or setting one or more of the bits of the LUT 530.

Turning now to FIG. 6, a flow chart shows a method of configuring a plurality of memory elements according to an embodiment of the present invention. A width of a data word is selected to be output at a step 602. The plurality of memory elements is configured to have a width less than the width of the data word at a step 604. The plurality of memory elements are arranged into groups of memory elements at a step 606 so that the sum of the widths of the memory elements is equal to the width of the data word. Any additional memory elements not arranged in the groups of memory elements are configured such that the sum of the widths of the additional memory elements is equal to the width of the data word. As shown for example in FIG. 3, four of the nine RAMs configured as 2048×9 memories for each of the two rows are used to generate 2048 thirty-six bit words. The one extra RAM is configured as a 512×36 RAM to provide an additional 512 thirty-six bit words. A circuit such as a multiplexer is configured to select one of a group of memory elements at a step 608. Configurable interconnects are provided between the multiplexer and the groups of memory elements at a step 610. The outputs of a plurality of memory elements are concatenated, for each group of memory elements, to generate an output comprising a data word at a step 612. Finally, a concatenated output of a group of memory elements is selected as an output data word at a step 614. The method of FIG. 6 may be implemented according to any of the circuits of FIGS. 2-5, or some other suitable circuit.

The selection of RAM sizes in steps 604 and 606 may be selected according to the following example to optimize the use of logic in an integrated circuit employing a plurality of RAMs. Because it is desirable to have the greatest number of RAMs in a row (and therefore RAMs having the smallest word for which the output word is divisible), it is determined how many RAMs having the smallest possible word size would comprise a row. In order to make the output multiplexer smaller, our deepest available row size of 4 RAMs of a RAM pool of nine is selected. In our example where the desired word size is thirty six, four RAMs which are configured as 2048×9 could be used to generate an output word having thirty six bits. That is, because a minimum width of the RAM is selected to be nine in order to include eight data bits and a parity bit, the RAMs are configured as 2048×9 RAMs. Because nine is greater than or equal to four when comparing the number of RAMs remaining in the RAM pool to the number of RAMs in a row, Row 0 comprises four RAMs, where each RAM is configured as a 2048×9 RAM. The size of our remaining RAM pool is then determined by subtracting four from nine, leading to a RAM pool of five. Because five is also greater than or equal to four, Row 1 may also comprise four RAMs, where each RAM is also 2048×9. After subtracting four from the RAM pool of five, the new RAM pool is determined to be one. Because the remaining RAM pool of one is less than four, another row of four RAMs may not be used, and the next row size of two (i.e. two 1024×18 RAMs) is selected. However, because the RAM pool of one is still less than two, a row of two RAMs may not be used. Therefore, Row 2 may be one RAM wide, where the RAM is configured as a 512×36 RAM. Because there are no RAMs left in the RAM pool, the configuration of RAMs and the allocation of RAMS in the RAM pool is stopped.

As shown in the example above, there are three rows of memory elements, and thus only three a 3-to-1 multiplexer is required to read intermediate data values simultaneously. Accordingly, allowing the RAM array to have a non-regular structure reduces the size of the multiplexer, and therefore reduces the complexity of the logic to select an output of a RAM or group of RAMs. As with any RAM multiplexer, the address range subtended by each row of the RAM array must be decoded. The address range of each row is determined by accumulation. For example, Row 0, comprising 2048×9 RAMs, subtends the lowest 2048 memory locations, 0-2047. Row 1, comprising 2048×9 RAMs, subtends the next 2048 memory locations, 2048-4095. Finally, Row 2, comprising one 512×36 RAM, subtends the next and final 512 memory locations, 4096-4607.

Accordingly, the procedure is to start with the largest number of RAMs possible in a row. For each row, it is necessary to determine whether the current number of RAMs per row is less than or equal to the quantity in the remaining RAM pool. If the current RAMs per row is less than or equal to the quantity in the remaining RAM pool, the current row will use that number of RAMs. This number is subtracted from the quantity in the remaining RAM pool. If the number of RAMs per row is greater the quantity in the remaining RAM pool, the current row may not use that number of RAMs. Accordingly, the next fewer number of RAMs per row is selected, and the comparison is repeated. The comparison of the number of RAMs per row to the quantity in the remaining RAM pool is performed until the number of RAMs in the remaining pool reaches zero. An accumulative process using the number of memory locations subtended by each row is then used to determine the range subtended by each row.

The method for allocating RAMs to a given row may be applied to any size RAM array, any data width and any selection of possible RAM sizes, even if a RAM size does not necessarily scale. For example, in the programmable device that has 18-kilobit RAMs, the available configurations are 512×36, 1024×18, 2048×9, 4096×4, 8192×2 and 16384×1. It should be noted that the 4096×4, 8192×2 and 16384×1 configurations do not scale perfectly to enable a nine bit block of data including eight data bits and one parity bit. Accordingly, the 2048×9 and 512×36 RAM sizes were selected in the example above to accommodate the nine bit block of data.

Turning now to FIG. 7, a flow chart shows a method of configuring a plurality of memory elements according to an alternate embodiment the present invention. A width of a data word is selected to be output by a circuit having a plurality of memory elements at a step 702. A minimum width for memory locations of the plurality of memory elements is selected at a step 704. The minimum width of the memory elements is selected by the user, and may be greater than one. For example, the minimum width in the example set forth above is selected to be nine to include the eight data bits and the one parity bit. That is, the minimum width may be a preferred width based upon a given application of the circuit or other considerations to optimize the use of resources in the circuit. The plurality of memory elements is configured to have the minimum width at a step 706. Memory elements are arranged into a first group of memory elements, wherein the sum of the widths of the memory elements is equal to the width of the data word at a step 708. It is then determined whether there are any additional memory elements which have not been allocated to a group at a step 710. If so, it is then determined whether there are enough memory elements to form another group at a step 712. If so, the memory elements are configured into a group at the step 708. If not, the remaining memory elements are configured such that the sum of the widths of the group of remaining memory elements is equal to the width of the data word at a step 714. The group may be equal to one, as described in the example above. Alternatively, more than one group may be formed having RAMs of different data widths, as described above. The outputs for the plurality of memory elements, for each of the various groups, are concatenated to generate a concatenated output comprising a data word at a step 716. A multiplexer coupled to receive the outputs of the groups of memory elements is provided at a step 718, wherein the multiplexer selects the output of one group of memory elements.

A CD ROM having code for implementing a method of configuring a plurality of memory elements according to one aspect of the present invention is attached as a part of this application and is herein incorporated by reference. The code reproduced in this patent document contains material subject to copyright protection. The copyright owner of that material has no objection to the facsimile reproduction of the patent document or the patent disclosure, as it appears in the Patent and Trademark Office patent files or records, but otherwise reserves all copyright rights.

It can therefore be appreciated that the new and novel circuit for and method of configuring a plurality of memory elements has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A method of configuring a plurality of memory elements having selectable dimensions, said method comprising:
   selecting a width of a data word to be output by a circuit having said plurality of memory elements;
   selecting a width for memory locations of said plurality of memory elements, said width for memory locations being less than said width of a data word;
   configuring said plurality of memory elements to have said selected width; and
   concatenating the outputs of each memory element of said plurality of memory elements to generate a concatenated output having said width of said data word.

2. The method of claim 1 further comprising a step of arranging said plurality of memory elements into groups of memory elements, wherein the sum of the widths of the memory elements, for each group of memory elements, is equal to the width of said data word.

3. The method of claim 2 wherein said step of arranging said plurality of memory elements into groups of memory elements comprises arranging a first group of memory elements to have fewer memory elements than a second group of memory elements.

4. The method of claim 3 further comprising a step of providing memory elements of said first group of memory elements with a width greater than a minimum width.

5. The method of claim 2 wherein said step of selecting a width for memory locations of said plurality of memory elements comprises selecting a width greater than one.

6. The method of claim 2 further comprising a step of providing a multiplexer coupled to receive the outputs of said groups of memory elements, said multiplexer selecting the output of one group of memory elements.

7. The method of claim 1 further comprising a step of configuring at least one additional memory element not arranged in said group of memory elements, wherein said at least one additional memory element comprises a width equal to the width of said data word.

8. A method of configuring a plurality of memory elements having selectable dimensions, said method comprising the steps of:
   selecting a width of a data word to be output by a circuit having said plurality of memory elements;
   configuring each memory element of said plurality of memory elements to have a width less than the width of said data word;
   arranging the plurality of memory elements into groups of memory elements;
   concatenating the outputs of the memory elements, for each group of memory elements, to generate an output comprising a data word; and
   selecting a concatenated output of a group of memory elements as an output data word.

9. The method of claim 8 wherein said step of arranging the plurality of memory elements into groups of memory elements comprises a step of arranging said plurality of memory elements such that the sum of the widths of the memory elements, for each group of memory elements, is equal to the width of said data word.

10. The method of claim 9 further comprising a step of configuring memory elements of a first group of memory elements to have a minimum width.

11. The method of claim 10 further comprising a step of configuring a second group of memory elements to have fewer memory elements than the number of memory elements of said first group of memory elements, wherein the sums of the widths of said second group of memory elements is equal to the width of said data word to be output.

12. The method of claim 8 wherein said step of selecting a concatenated output of a group of memory elements comprises configuring a circuit of a programmable logic device to select an output of one of said groups of memory elements.

13. The method of claim 12 wherein said step of configuring a circuit of a programmable logic device comprises a step of configuring a multiplexer to select an output of one of said groups of memory elements.

14. The method of claim 13 wherein said step of configuring a circuit of a programmable logic device further comprises a step of providing configurable interconnects between said multiplexer and said groups of memory elements.

15. A circuit for configuring a plurality of memory elements having selectable dimensions, said circuit comprising:
   a control circuit coupled to said plurality of memory elements, said control circuit configuring the dimensions of said plurality of memory elements;
   a first plurality of memory elements, wherein each memory element has a width less than a width of a data word stored in said first plurality of memory elements;
   a first bus coupled to said first plurality of memory elements, said first bus generating a first data word comprising concatenated outputs of each memory element of said first plurality of memory elements; and
   a selection circuit coupled to said first bus and outputting said first data word.

16. The circuit of claim 15 further comprising a second plurality of memory elements, wherein each memory element of said second plurality of memory elements has a width less than the width of a data word stored in said second plurality of memory elements.

17. The circuit of claim 16 wherein said second plurality of memory elements comprises a number of memory elements which is equal to the number of memory elements of said first plurality of memory elements.

18. The circuit of claim 16 wherein said second plurality of memory elements comprises a number of memory elements which is less than the number of memory elements of said first plurality of memory elements.

19. The circuit of claim 16 further comprising a second bus coupled to said second plurality of memory elements, said second bus receiving the outputs of each memory element of said second plurality of memory elements to generate a second data word comprising concatenated outputs of said second plurality of memory elements.

20. The circuit of claim 19 wherein said selection circuit coupled to said first bus comprises a multiplexer configured in a programmable logic device to select one of said first data word or said second data word.

* * * * *